(12) United States Patent
Luo et al.

(10) Patent No.: US 9,476,921 B2
(45) Date of Patent: Oct. 25, 2016

(54) SYSTEMS AND METHODS FOR SENSING CURRENT WHILE MINIMIZING MEASUREMENT ERROR AND POWER LOSS

(71) Applicant: Dell Products L.P., Round Rock, TX (US)

(72) Inventors: Shiguo Luo, Austin, TX (US); George Gilman Richards, III, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 372 days.

(21) Appl. No.: 14/281,129

(22) Filed: May 19, 2014

(65) Prior Publication Data

US 2015/0331049 A1    Nov. 19, 2015

(51) Int. Cl.
*G01R 19/15* (2006.01)
*G05F 1/46* (2006.01)
*H02M 3/158* (2006.01)
*G01R 19/165* (2006.01)
*G01R 31/327* (2006.01)
*G05F 1/26* (2006.01)
*G01R 31/40* (2014.01)
*H02M 1/00* (2006.01)

(52) U.S. Cl.
CPC ......... *G01R 19/16538* (2013.01); *G01R 19/15* (2013.01); *G01R 31/3277* (2013.01); *G05F 1/26* (2013.01); *G05F 1/46* (2013.01); *H02M 3/1584* (2013.01); *G01R 31/40* (2013.01); *H02M 2001/0009* (2013.01); *H02M 2001/0048* (2013.01); *H02M 2003/1586* (2013.01)

(58) Field of Classification Search
CPC .. G01R 19/145; G01R 19/15; G01R 19/155; H02M 2001/0006; H02M 2001/0009; H02M 2001/0048; H02M 3/1584; H02M 2003/1586
See application file for complete search history.

(56) References Cited

U.S. PATENT DOCUMENTS

| | | | | |
|---|---|---|---|---|
| 6,424,129 | B1 * | 7/2002 | Lethellier | H02M 3/1584 323/272 |
| 8,564,269 | B2 * | 10/2013 | Mohr | G01R 19/0092 323/222 |
| 2009/0315527 | A1 * | 12/2009 | Kung | H02M 3/158 323/282 |
| 2010/0283422 | A1 * | 11/2010 | Tan | H02P 6/28 318/720 |
| 2013/0193874 | A1 * | 8/2013 | Takahashi | G05F 1/468 315/297 |
| 2013/0258531 | A1 * | 10/2013 | Li | B60L 3/04 361/42 |
| 2014/0347078 | A1 * | 11/2014 | Qin | G01R 19/0092 324/713 |
| 2016/0116549 | A1 * | 4/2016 | Mathew | G01R 21/00 702/60 |

* cited by examiner

*Primary Examiner* — Jessica Han
(74) *Attorney, Agent, or Firm* — Jackson Walker L.L.P.

(57) ABSTRACT

A method may include deactivating a switch of a measurement circuit during a measurement portion of at least one voltage regulator phase, wherein each of the at least one voltage regulator phase is integral to a voltage regulator and each of the at least one voltage regulator phase comprises a power stage. The power stage may include a high-side switch for delivering electrical current to the at least one information handling resource in conformity with a first duty cycle of the high-side switch. The power stage may also include a low-side switch for sinking electrical current to an electrical ground in conformity with a second duty cycle of the low-side switch. The method may also include measuring a voltage across a sense resistor of the measurement circuit during the measurement portion, wherein the sense resistor is coupled in parallel with non-gate terminals of the switch.

17 Claims, 3 Drawing Sheets

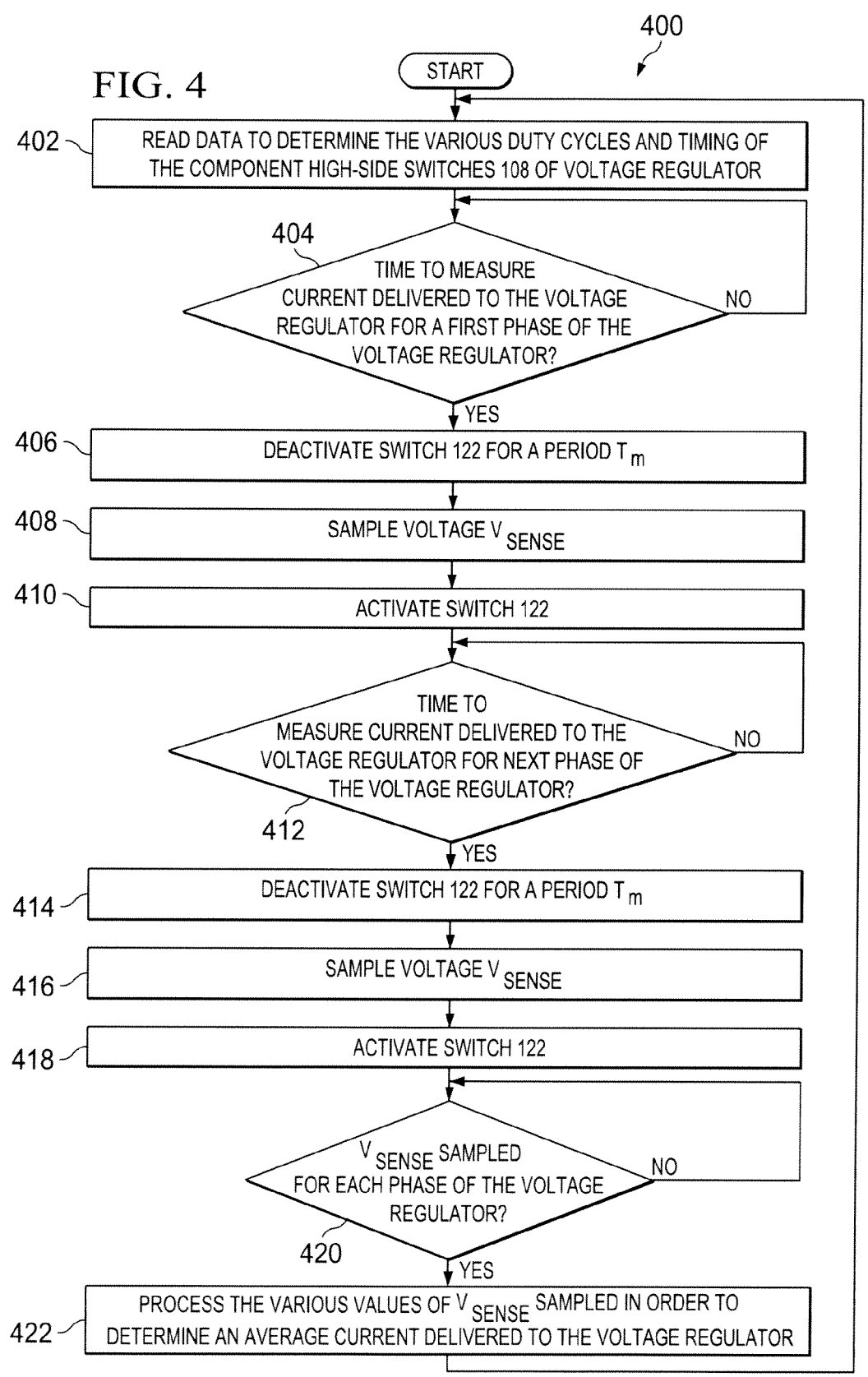

SYSTEMS AND METHODS FOR SENSING CURRENT WHILE MINIMIZING MEASUREMENT ERROR AND POWER LOSS

TECHNICAL FIELD

The present disclosure relates in general to information handling systems, and more particularly to sensing a current associated with a voltage regulator in an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

An information handling system may include a voltage regulator to provide a constant voltage level and a current to power the system. For example, a voltage regulator may receive an input voltage and produce an output current at a predetermined output voltage required by a load, i.e., the circuit element(s) for which it is providing power. Moreover, modern information handling systems may include components that maintain current requirements across a broad range from relatively high peak currents to very low stable currents. More particularly, voltage regulators may be required to maintain a high efficiency, or low power loss, over such ranges. In particular, a direct current to direct current (DC-DC) voltage regulator may include a controller, one or more drivers, and one or more power stages. Furthermore, a power stage may include one or more metal-oxide-semiconductor-field-effect-transistors (MOSFETs), which may be driven by the drivers.

Additionally, some voltage regulators may be capable of operating in multiple phases. To this end, the concept of a phase for a voltage regulator may typically refer to combining a driver and a power stage to form one phase. Thus, a multi-phase voltage regulator may include multiple instances of such combinations. Alternatively, a multi-phase voltage regulator may be thought of as a combination of single phase voltage regulators. For example, a multi-phase voltage regulator may include a plurality of single phase voltage regulators coupled in parallel to provide varying ranges of output current. During periods of high loads, the multi-phase voltage regulator may function with all phases in operation. In contrast, for lower loads, it may employ phase-shedding and operate with a reduced number of phases.

To manage power delivery and consumption by voltage regulators, power control systems in information handling systems often execute power management algorithms. For such power management algorithms to effectively manage power, accurate power measurements must be obtained. An inherent conflict in obtaining power measurements is that measurement circuitry itself may add power losses to a system.

In order to measure power consumption, both a voltage and a current must be obtained. As power consumed by loads (e.g., CPU) is first processed by a voltage regulator, the input power to a voltage regulator may equal the product of a voltage delivered to the voltage regulator and a current delivered to the voltage regulator. Existing approaches to measuring current associated with a voltage regulator include sensing a current in a component of a voltage regulator, such as a filter inductor of switching transistor integral to the voltage regulator, each of which has parasitic impedances. Current flowing through such components is linearly proportional to a voltage drop across such parasitic impedances. Thus by measuring a voltage across such components, a current associated with a voltage regulator may be obtained.

An advantage of using such components to obtain a current is that such impedances and their power losses are inherent to a voltage regulator, and thus such measurement approaches add little or no appreciable power consumption themselves. However, the impedances of these components may have large ranges of variation, and thus may result in unacceptable measurement error.

Accordingly, in order to obtain accurate real-time measurement of voltage regulator power, an additional impedance must often be inserted in series with the input power delivery path to a voltage regulator, and thus results in increased power loss. However, a disadvantage with such approach is that measurement accuracy and power dissipation of the impedance are in conflict with each other: to achieve greater measurement sensitivity, it may be desirable to use a larger impedance, but use of a larger impedance may lead to larger power loss.

SUMMARY

In accordance with the teachings of the present disclosure, the disadvantages and problems associated with current sensing in a voltage regulator have been reduced or eliminated.

In accordance with embodiments of the present disclosure, an information handling system may include at least one information handling resource, a voltage regulator, a measurement circuit, and a control circuit. The voltage regulator may be coupled to the at least one information handling resource and may include at least one voltage regulator phase having a power stag. The power stage may include a high-side switch for delivering electrical current to the at least one information handling resource in conformity with a first duty cycle of the high-side switch, the first duty cycle defining a duration of time in which the high-side switch is activated. The power stage may also include a low-side switch for sinking electrical current to an electrical ground in conformity with a second duty cycle of the low-side switch, the second duty cycle defining a duration of time in which the low-side switch is activated. The measurement circuit may be for measuring an electrical current delivered to the voltage regulator, and may include a sense resistor and a switch, wherein non-gate terminals of the switch are coupled in parallel with the sense resistor. The control circuit may be configured to, during a measurement portion of at least one of the first duty cycle and the second duty cycle of the at least one voltage regulator phase deactivate the switch of the measurement circuit and measure a voltage across the sense resistor.

In accordance with these and other embodiments of the present disclosure, a method may include deactivating a switch of a measurement circuit during a measurement portion of at least one voltage regulator phase, wherein each of the at least one voltage regulator phase is integral to a voltage regulator and each of the at least one voltage regulator phase comprises a power stage. The power stage may include a high-side switch for delivering electrical current to the at least one information handling resource in conformity with a first duty cycle of the high-side switch, the first duty cycle defining a duration of time in which the high-side switch is activated. The power stage may also include a low-side switch for sinking electrical current to an electrical ground in conformity with a second duty cycle of the low-side switch, the second duty cycle defining a duration of time in which the low-side switch is activated. The method may also include measuring a voltage across a sense resistor of the measurement circuit during the measurement portion, wherein the sense resistor is coupled in parallel with non-gate terminals of the switch.

In accordance with these and other embodiments of the present disclosure, a voltage regulator may include at least one voltage regulator phase having a power stage, a measurement circuit, and a control circuit. The power stage may include a high-side switch for delivering electrical current to the at least one information handling resource in conformity with a first duty cycle of the high-side switch, the first duty cycle defining a duration of time in which the high-side switch is activated and a low-side switch for sinking electrical current to an electrical ground in conformity with a second duty cycle of the low-side switch, the second duty cycle defining a duration of time in which the low-side switch is activated. The measurement circuit may be for measuring an electrical current delivered to the voltage regulator, the measurement circuit may include a sense resistor and a switch, wherein non-gate terminals of the switch are coupled in parallel with the sense resistor. The control circuit may be configured to, during a measurement portion of the first duty cycle or the second duty cycle of the at least one voltage regulator phase deactivate the switch of the measurement circuit and measure a voltage across the sense resistor.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 4 illustrates a flow chart of an example method for sensing a current delivered to a voltage regulator, in accordance with embodiments of the present disclosure.

DETAILED DESCRIPTION

Preferred embodiments and their advantages are best understood by reference to FIGS. 1-4, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal data assistant (PDA), a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, power supplies, air movers (e.g., fans and blowers) and/or any other components and/or elements of an information handling system.

Figure 1:
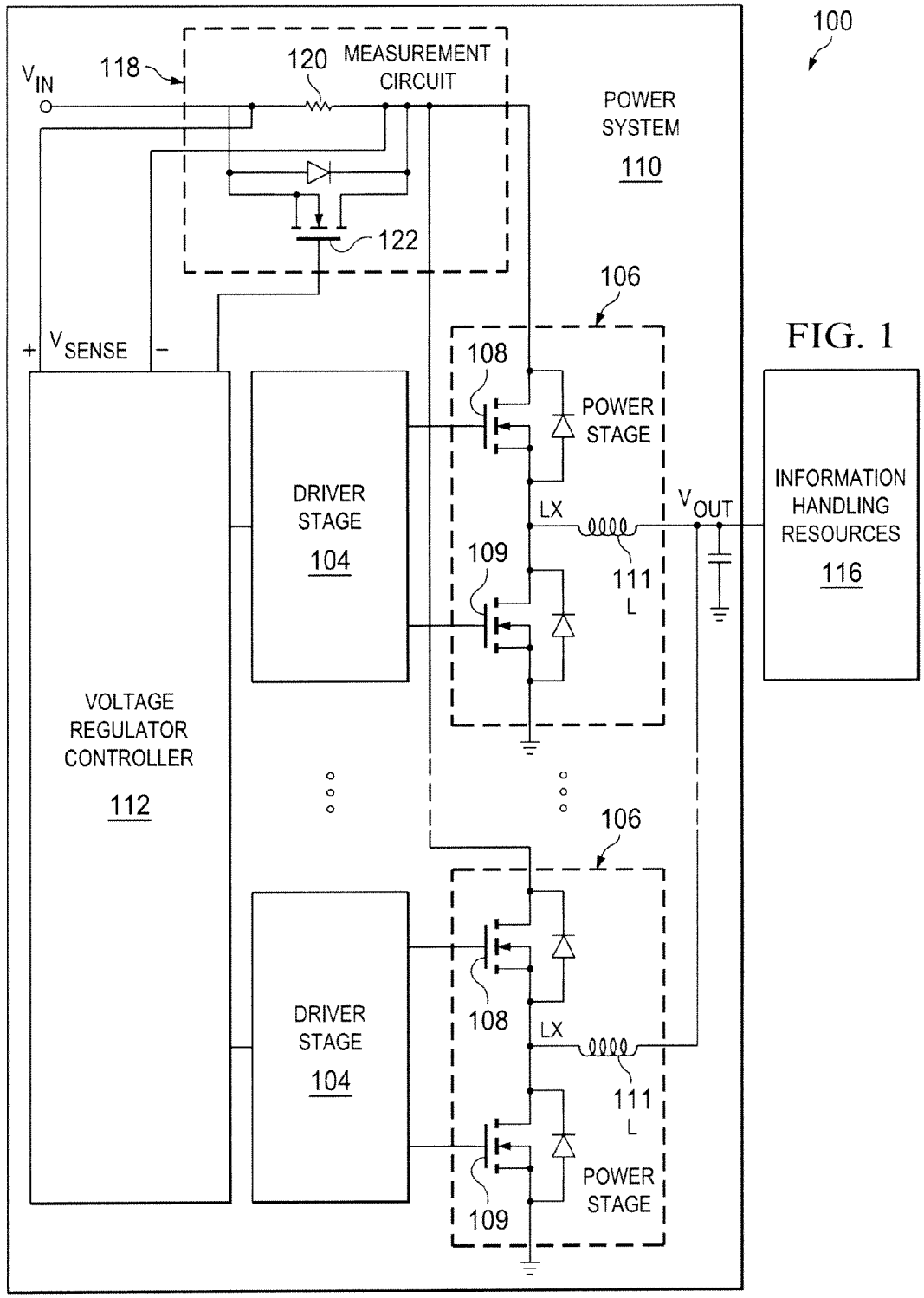
FIG. 1 illustrates a block diagram of an example of an information handling system, in accordance with embodiments of the present disclosure.

FIG. 1 illustrates a block diagram of an example of an information handling system 100 incorporating a power system 110 in accordance with an embodiment of the present disclosure. As depicted, information handling system 100 may include a power system 110, and one or more other information handling resources 116.

Generally speaking, power system 110 may include any system, device, or apparatus configured to supply electrical current to one or more information handling resources 116. In some embodiments, power system 110 may include a multi-phase voltage regulator.

Power system 110 may include a voltage regulator controller 112 and a plurality of voltage regulator phases wherein each voltage regulator phase comprises a driver stage 104 and a power stage 106. Voltage regulator controller 112 may include any system, device, or apparatus configured to control the output of power system 110 and/or selectively enable and disable voltage regulator phases.

As stated above, each voltage regulator phase may include a driver stage 104 and a power stage 106. A voltage regulator phase may include any system, device, or apparatus configured to supply a portion of the total current output of power system 110. In embodiments in which power system 110 is a multi-phase voltage regulator, a voltage regulator phase may comprise a phase of the voltage regulator.

A driver stage 104 may include a high-side driver and a low-side driver LDRV. A power stage 106 may comprise a high-side switch 108, low-side switch 109, and output inductor 111. High-side switch 108 may comprise any suitable switching device (e.g., a metal-oxide-semiconductor field-effect transistor or "MOSFET") located between a positive terminal of a power supply $V_{IN}$ and a load, while low-side switch 109 may comprise any suitable switching device (e.g., a MOSFET) located between the load and a negative terminal of the power supply or ground. A phase node voltage LX may be generated based on the supply voltage $V_{IN}$ and switching of switches 108 and 110 and may also indicate a junction point between high-side switch 108 and low-side switch 109. Output inductor 111 may be coupled between phase node LX and the output of the voltage regulator phase, which may serve to boost or reduce supply voltage $V_{IN}$ to generate output voltage $V_{OUT}$ such that the voltage regulator phase functions as a direct-current to direct-current voltage converter.

In operation, driver 104 may activate and deactivate high-side switches 108 and low-side switches 109 in response to a switching signal from voltage regulator controller 112. High-side switches 108 and low-side switches 109 may operate in a complementary mode, with one of the high-side switches 108 and low-side switches 109 of each phase activated and one deactivated during steady-state operating conditions. When a high-side switch 108 of a phase is activated and its corresponding low-side switch 109 is deactivated, the input power will charge the inductor 111 and supply a current to information handling resources 116. Conversely, when the low-side switch 109 is activated and the high-side switch 108 is deactivated, the inductor current will be discharged by a freewheeling loop consisting of inductor 111, an output capacitor coupled between $V_{OUT}$ and a ground voltage, and low-side switch 109.

Although FIG. 1 depicts two voltage regulator phases each comprising a driver stage 104 and power stage 106, power system 110 may include any suitable number of voltage regulator phases.

Generally speaking, information handling resources 116 may include any component system, device or apparatus of information handling system 100, including without limitation processors, buses, computer-readable media, input-output devices and/or interfaces, storage resources, network interfaces, motherboards, electro-mechanical devices (e.g., fans), displays, and/or power supplies.

Measurement circuit 118 may comprise any suitable system, device, or apparatus for measuring an input current flowing from a supply voltage $V_{IN}$ to power stages 106. As shown in FIG. 1, measurement circuit 118 may comprise a sense resistor 120 and a switch 122. Sense resistor 120 may include a passive two-terminal electrical component wherein the current through sense resistor 120 is substantially in direct proportion to the voltage across the terminals of sense resistor 120, in accordance with Ohm's law. Switch 122 may comprise any suitable switching device (e.g., a metal-oxide-semiconductor field-effect transistor or "MOSFET") coupled in parallel at its non-gate terminals with sense resistor 120 and coupled at its gate terminal to voltage regulator controller 112. Although measurement circuit 118 is shown in FIG. 1 as integral to power system 110, measurement circuit 118 may be placed in any suitable location within information handling system 100, including, without limitation, internal to voltage regulator controller 112 or external to power system 110.

In operation, voltage regulator controller 112 may selectively enable and disable one or more voltage regulator phases in response to an electrical power requirement of information handling resources, such that one or more phases may be shed to reduce power consumption of power system 110 in response to the reduced current requirement, and thus increase power efficiency of information handling system 100. Accordingly, voltage regulator controller 112 may control driver stages 104 such that the appropriate power stages 106 provide the desired level of power to information handling resources 116.

In addition, voltage regulator controller 112 may control switch 122 such that measurement circuit 118 may measure a current during a measurement portion of a duty cycle of each voltage regulator phase, while reducing the impedance of measurement circuit 118, and thus the power loss of measurement circuit 118, during non-measurement portions of a duty cycle other than the measurement portion. Thus, during the measurement portion, voltage regulator controller 112 may deactivate (e.g., open, turn off, etc.) switch 122, such that measurement circuit 118 may comprise a substantially large impedance, permitting accurate current measurements across sense resistor 120. During the non-measurement portions, voltage regulator controller 112 may activate (e.g., close, turn on, etc.) switch 122, such that measurement circuit 118 comprises a substantially small impedance wherein measurement circuit 118 consumes a relatively small amount of power.

Figure 2:
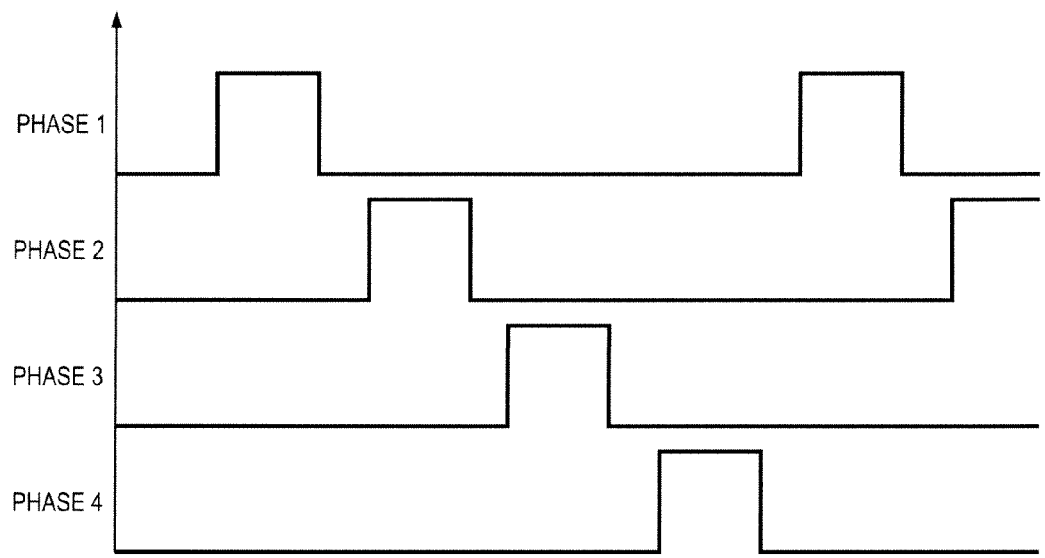
FIG. 2 illustrates a graph depicting example pulse-width modulation pulses at the gate terminal of high-side switches of a four-phase voltage regulator.
Figure 3:
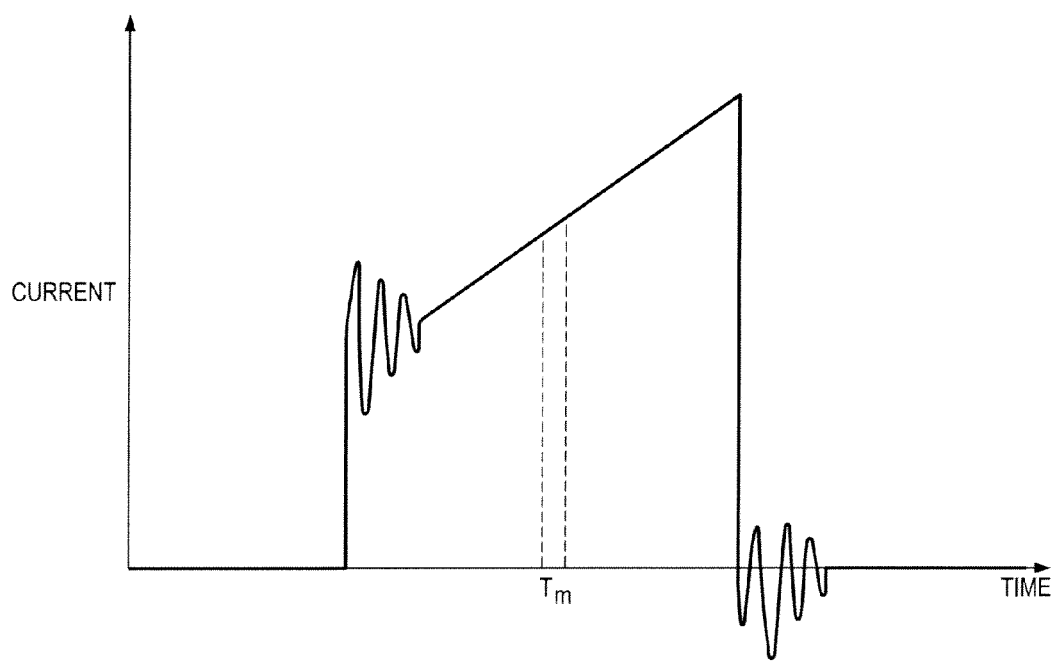
FIG. 3 illustrates a graph depicting an example waveform of a current through measurement circuit during a duty cycle of a high-side switch, in accordance with embodiments of the present disclosure.

To further illustrate example embodiments for activating and deactivating switch 122 and timing of the measurement portions and non-measurement portions of a voltage regulator duty cycle, reference is made to FIGS. 2 and 3. FIG. 2 illustrates a graph depicting example pulse-width modulation pulses at the gate terminal of high-side switches 108 of a four-phase voltage regulator, in accordance with embodiments of the present disclosure. As shown in FIG. 2, the gate terminals of high-side switches of the respective phases of the voltage regulator may be, in steady-state operation, driven by their respective driver stages 104 in a phase interleaving pattern, such that the high-side switch 108 of only one voltage regulator phase is driven at one time, and the high-side switches 108 of the various phases are driven in a cyclical order. The time in which a high-side switch 108 is driven may be referred to as a duty cycle of the high-side switch 108.

FIG. 3 illustrates a graph depicting an example waveform of a current through measurement circuit 118 during a duty cycle of a high-side switch 108, in accordance with embodiments of the present disclosure. As is shown in FIG. 3, during the beginning and end of a duty cycle of a high-side switch 118, the current waveform may experience ringing. To avoid such ringing noise occurring at the beginning and end of the duty cycle, voltage regulator controller 112 may deactivate switch 122 during a measurement portion $T_m$ depicted in FIG. 3 which is substantially outside of the portions of the duty cycle in which the current experiences such ringing (e.g., in a substantially linear portion of the current waveform). In some embodiments, the measurement portion $T_m$ may be approximately centered in the center of the duty cycle of the high-side switch 108. In other embodiments, the measurement portion $T_m$ may be approximately centered in the center of the duty cycle of the low-side switch 109.

FIG. 4 illustrates a flow chart of an example method 400 for sensing a current delivered to a voltage regulator, in accordance with embodiments of the present disclosure. According to one or more embodiments, method 400 may begin at step 402. As noted above, teachings of the present disclosure may be implemented in a variety of configurations of information handling system 100. As such, the preferred initialization point for method 400 and the order of the steps comprising method 400 may depend on the implementation chosen.

At step 402, voltage regulator controller 112 may read data to determine the various duty cycles and timing of the component high-side switches 108 of a voltage regulator, from which it may determine timing for activating and deactivating switch 122.

At step 404, voltage regulator controller 112 may determine if it is time to measure current delivered to the voltage regulator for a first phase of the voltage regulator. If it is time to measure the current (e.g., if it is time for measurement portion $T_m$ to begin), method 400 may proceed to step 406. Otherwise, method 400 may remain at step 404 until measurement portion $T_m$ begins.

At step 406, voltage regulator controller 112 may deactivate switch 122 for a period $T_m$. During such period $T_m$, at step 408, voltage regulator controller may sample a voltage $V_{sense}$ indicative of the current delivered to the voltage regulator during the first phase. At step 410, voltage regulator controller 112 may activate switch 122 at the conclusion of measurement period $T_m$. After completion of step 410, steps 412-420 may be repeated for each phase of the voltage regulator.

At step 412, voltage regulator controller 112 may determine if it is time to measure current delivered to the voltage regulator for the next phase of the voltage regulator. If it is time to measure the current (e.g., if it is time for measurement portion $T_m$ to begin), method 400 may proceed to step 414. Otherwise, method 400 may remain at step 412 until measurement portion $T_m$ begins.

At step 414, voltage regulator controller 112 may deactivate switch 122 for a period $T_m$. During such period $T_m$, at step 416, voltage regulator controller may sample a voltage $V_{sense}$ indicative of the current delivered to the voltage regulator during the phase. At step 418, voltage regulator controller 112 may activate switch 122 at the conclusion of period $T_m$. At step 420, voltage regulator controller 112 may determine if voltage $V_{sense}$ has been sampled for each phase of the voltage regulator. If voltage $V_{sense}$ has been sampled for each phase of the voltage regulator, method 400 may proceed to step 422. Otherwise, method 400 may proceed again to step 412.

At step 422, voltage regulator controller 112 may process the various values of $V_{sense}$ sampled in order to determine an average current delivered to the voltage regulator. Based on such average current, voltage regulator controller 112 or another component of information handling system 100 may perform an action in reaction thereto. After completion of step 422, method 400 may proceed again to step 402.

Although FIG. 4 discloses a particular number of steps to be taken with respect to method 400, method 400 may be executed with greater or fewer steps than those depicted in FIG. 4. In addition, although FIG. 4 discloses a certain order of steps to be taken with respect to method 400, the steps comprising method 400 may be completed in any suitable order.

Method 400 may be implemented using information handling system 100 or any other system operable to implement method 400. In certain embodiments, method 400 may be implemented partially or fully in software and/or firmware embodied in computer-readable media and executable on a processor of information handling system 100.

The benefit of these methods and systems is that during the majority time of a duty cycle, a smaller resistance may be conducting current, resulting in lower average power dissipation as compared to the case in which only a large resistance is always present in order to generate a sufficiently large enough current sense signal. During the majority of the a duty cycle, switch 122 may be turned on and may conduct a partial current, resulting in a lower power loss. During a measurement period of the duty cycle, switch 122 may be turned off, thus causing a current sense voltage to be generated by current flowing through resistor 120. It is during this measurement period that the current sense voltage may be sampled.

Although the present disclosure has been described in detail, it should be understood that various changes, substitutions, and alterations can be made hereto without departing from the spirit and the scope of the disclosure as defined by the appended claims.

What is claimed is:
1. An information handling system comprising:
at least one information handling resource;
a voltage regulator coupled to the at least one information handling resource, the voltage regulator comprising at least one voltage regulator phase having a power stage comprising:
a high-side switch for delivering electrical current to the at least one information handling resource in conformity with a first duty cycle of the high-side switch, the first duty cycle defining a duration of time in which the high-side switch is activated; and
a low-side switch for sinking electrical current to an electrical ground in conformity with a second duty cycle of the low-side switch, the second duty cycle defining a duration of time in which the low-side switch is activated;
a measurement circuit for measuring an electrical current delivered to the voltage regulator, the measurement circuit comprising:
a sense resistor; and
a switch, wherein non-gate terminals of the switch are coupled in parallel with the sense resistor; and a control circuit configured to, during a measurement portion of at least one of the first duty cycle and the second duty cycle of the at least one voltage regulator phase:
    deactivate the switch of the measurement circuit; and
    measure a voltage across the sense resistor.

2. The information handling system of claim 1, wherein the control circuit is further configured to deactivate the switch of the measurement circuit during portions of the first duty cycle and second duty cycle outside of the measurement portion.

3. The information handling system of claim 1, wherein the control circuit is further configured to control the first duty cycle of each high-side switch and the second duty cycle of each low-side switch.

4. The information handling system of claim 1, wherein the measurement portion occurs during a period of each first duty cycle or each second duty cycle in which the current is substantially linear as a function of time.

5. The information handling system of claim 1, wherein the measurement portion occurs during a period of each first duty cycle or each second duty cycle in which current ringing is not present in the current.

6. The information handling system of claim 1, wherein the measurement portion is approximately centered in the first duty cycle or second duty cycle.

7. A method comprising:
deactivating a switch of a measurement circuit during a measurement portion of at least one voltage regulator phase, wherein:
    each of the at least one voltage regulator phase is integral to a voltage regulator; and
    each of the at least one voltage regulator phase comprises a power stage having:
        a high-side switch for delivering electrical current to the at least one information handling resource in conformity with a first duty cycle of the high-side switch, the first duty cycle defining a duration of time in which the high-side switch is activated; and
        a low-side switch for sinking electrical current to an electrical ground in conformity with a second duty cycle of the low-side switch, the second duty cycle defining a duration of time in which the low-side switch is activated; and
measuring a voltage across a sense resistor of the measurement circuit during the measurement portion, wherein the sense resistor is coupled in parallel with non-gate terminals of the switch.

8. The method of claim 7, further comprising deactivating the switch of the measurement circuit during portions of the first duty cycle and second duty cycle outside of the measurement portion of the duty cycle.

9. The method of claim 7, wherein the measurement portion occurs during a period of each first duty cycle or second duty cycle in which the current is substantially linear as a function of time.

10. The method of claim 7, wherein the measurement portion occurs during a period of each first duty cycle and each second duty cycle in which current ringing is not present in the current.

11. The method of claim 7, wherein the measurement portion is approximately centered in the first duty cycle or the second duty cycle.

12. A voltage regulator comprising:
at least one voltage regulator phase having a power stage comprising;
    a high-side switch for delivering electrical current to the at least one information handling resource in conformity with a first duty cycle of the high-side switch, the first duty cycle defining a duration of time in which the high-side switch is activated; and
    a low-side switch for sinking electrical current to an electrical ground in conformity with a second duty cycle of the low-side switch, the second duty cycle defining a duration of time in which the low-side switch is activated;
a measurement circuit for measuring an electrical current delivered to the voltage regulator, the measurement circuit comprising:
    a sense resistor; and
    a switch, wherein non-gate terminals of the switch are coupled in parallel with the sense resistor; and
a control circuit configured to, during a measurement portion of the first duty cycle or the second duty cycle of the at least one voltage regulator phase:
    deactivate the switch of the measurement circuit; and
    measure a voltage across the sense resistor.

13. The voltage regulator of claim 12, wherein the control circuit is further configured to deactivate the switch of the measurement circuit during portions of the first duty cycle and the second duty cycle outside of the measurement portion.

14. The voltage regulator of claim 12, wherein the control circuit is further configured to control the first duty cycle and the second duty cycle.

15. The voltage regulator of claim 12, wherein the measurement portion of each first duty cycle and each second duty cycle occurs during a period in which the current is substantially linear as a function of time.

16. The voltage regulator of claim 12, wherein the measurement portion occurs during a period of each first duty cycle or each second duty cycle in which current ringing is not present in the current.

17. The voltage regulator of claim 12, wherein the measurement portion is approximately centered in the first duty cycle or the second duty cycle.

* * * * *